United States Patent
Bradley

(10) Patent No.: US 9,673,655 B2
(45) Date of Patent: Jun. 6, 2017

(54) APPARATUS AND METHODS OF CHARGING TO SAFE CELL VOLTAGE

(71) Applicant: Fairchild Semiconductor Corporation, San Jose, CA (US)

(72) Inventor: Larry Dean Bradley, Carlsbad, CA (US)

(73) Assignee: FAIRCHILD SEMICONDUCTOR CORPORATION, San Jose, CA (US)

( * ) Notice: Subject to any disclaimer, the term of this patent is extended or adjusted under 35 U.S.C. 154(b) by 273 days.

(21) Appl. No.: 14/587,221

(22) Filed: Dec. 31, 2014

(65) Prior Publication Data

US 2015/0188329 A1 Jul. 2, 2015

Related U.S. Application Data

(60) Provisional application No. 61/922,530, filed on Dec. 31, 2013.

(51) Int. Cl.
*H02J 7/00* (2006.01)
*G01R 31/36* (2006.01)

(52) U.S. Cl.
CPC .......... *H02J 7/007* (2013.01); *G01R 31/3662* (2013.01)

(58) Field of Classification Search
CPC .... H02J 7/025; H02J 7/007; H02J 7/04; H02J 7/1423; H02J 7/0013; H02J 7/0014; H02J 7/0024; H02J 7/0019; H02J 7/008; H02J 50/12; H02M 2001/0025; H01M 2010/4271; H01M 10/44; H01M 10/446
USPC ....................................................... 320/107
See application file for complete search history.

(56) References Cited

U.S. PATENT DOCUMENTS

| | | |
|---|---|---|
| 5,055,763 A | 10/1991 | Johnson et al. |
| 5,122,751 A | 6/1992 | Aita et al. |
| 5,670,862 A | 9/1997 | Lewyn |
| 5,680,031 A | 10/1997 | Pavlovic et al. |
| 5,903,136 A | 5/1999 | Takahashi et al. |
| 7,683,574 B2 | 3/2010 | Guang et al. |
| 8,111,035 B2 | 2/2012 | Nishino et al. |
| 8,487,630 B2 | 7/2013 | Mori |
| 2005/0194933 A1 | 9/2005 | Arnold et al. |
| 2008/0042695 A1* | 2/2008 | Yen ...................... G11C 27/024 327/95 |
| 2011/0148372 A1* | 6/2011 | Mariani ................ H02M 3/156 323/272 |

(Continued)

FOREIGN PATENT DOCUMENTS

CN 1437031 A 8/2003

OTHER PUBLICATIONS

Lin, Chia-Hsiang, et al., "Built-in Resistance Compensation (BRC) Technique for Fast Charging Li-Ion Battery Charger", IEEE, 2008 Custom Integrated Circuits Conference (CICC), (2008), 3-5-1 to 3-5-4.

*Primary Examiner* — Drew A Dunn
*Assistant Examiner* — Sailesh Thapa
(74) *Attorney, Agent, or Firm* — Schwegman Lundberg & Woessner, P.A.

(57) ABSTRACT

This document discusses, among other things, a charge regulator configured to optimize charging of an energy storage device by measuring an internal voltage drop of the energy storage device using an open circuit voltage (OCV) across the terminals of the energy storage device during charging and a voltage across the terminals of the energy storage device during charging (CCV).

20 Claims, 4 Drawing Sheets

(56) References Cited

U.S. PATENT DOCUMENTS

2012/0098481 A1     4/2012  Hunter et al.
2014/0152234 A1*    6/2014  Herrmann ............... H02J 7/007
                                                    320/107

* cited by examiner

APPARATUS AND METHODS OF CHARGING TO SAFE CELL VOLTAGE

CLAIM OF PRIORITY

This application claims the benefit of priority under 35 U.S.C. §119(e) of Larry D. Bradley, U.S. Provisional Patent Application Ser. No. 61/992,530, titled "APPARATUS AND METHODS OF CHARGING TO SAFE CELL VOLTAGE," filed on Dec. 31, 2013, which is incorporated by reference herein in its entirety.

BACKGROUND

Efficient and timely charging of mobile electronic devices are important to users, and can differentiate the popularity of one device over another. To estimate energy storage device (e.g., battery) voltage, existing charging methods rely on a Kelvin connection to compensate for circuit board drops and an approximated value of internal energy storage device resistance to estimate the internal voltage drop of the energy storage device. However, because the actual internal energy storage device resistance value is not known, and moreover, varies with temperature, state of charge, etc., existing charging methods leave safe margins within their estimates to prevent energy storage device damage. Accordingly, existing methods do not provide for the most accurate or expedient charging of energy storage devices.

FIG. 1 illustrates generally an example prior art charging circuit, including a charge regulator 105 and a battery 110. The charge regulator 105 is configured to receive a reference voltage and a terminal voltage of the battery 110, and to provide a charging current to the battery 110 using the reference voltage and the terminal voltage.

OVERVIEW

This document discusses, among other things, a charge regulator configured to optimize charging of an energy storage device by measuring an internal voltage drop of the energy storage device using an open circuit voltage (OCV) across the terminals of the energy storage device during charging and a voltage across the terminals of the energy storage device during charging (CCV).

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventor has recognized, among other things, apparatus and methods for measuring resistance of a charge path of an energy storage device, including an internal storage device resistance, without interrupting operation or significantly burdening charging of the electronic device. In certain examples, the measured resistance can then be used to quickly and accurately charge the energy storage device. In some examples, measurements can continue to be made during the charging process to optimize charging, such as to program a charger float voltage plus the measured resistive drop. Energy storage devices can include batteries, capacitors, solar cells, or one or more other devices configured to generate or store energy to be used by an electronic device.

In general, cell voltage of an energy storage device is less than the terminal voltage of the energy storage device during charging due to an internal voltage drop of the energy storage device. The present subject matter provides, among other things, apparatus and methods for measuring the internal voltage drop of the energy storage device, which can then be used to optimize the charging process to reduce the charging time and more accurately charge the energy storage device compared to existing methods that fail to accurately compensate for the internal voltage drop of the energy storage device. In some examples, a difference between the voltage across the battery terminals when the battery is charging and the voltage across the battery terminals after a charge current is removed can be used to measure the internal voltage drop of the battery to optimize and optimize battery charging.

In an example, a method for providing improved charging of an energy storage device includes determining a difference between an open circuit voltage (OCV) across the terminals of the energy storage device and a voltage across the terminals of the energy storage device during charging (CCV). The difference can be subtracted from the CCV and provided to a charge regulator, or added to a desired or programmed charge voltage (e.g., a reference voltage) to compensate for voltage drop due to internal resistance of the energy storage device and to optimize charging of the energy storage device. The difference can be provided to the charge regulator as a closed loop feedback.

Figure 1:
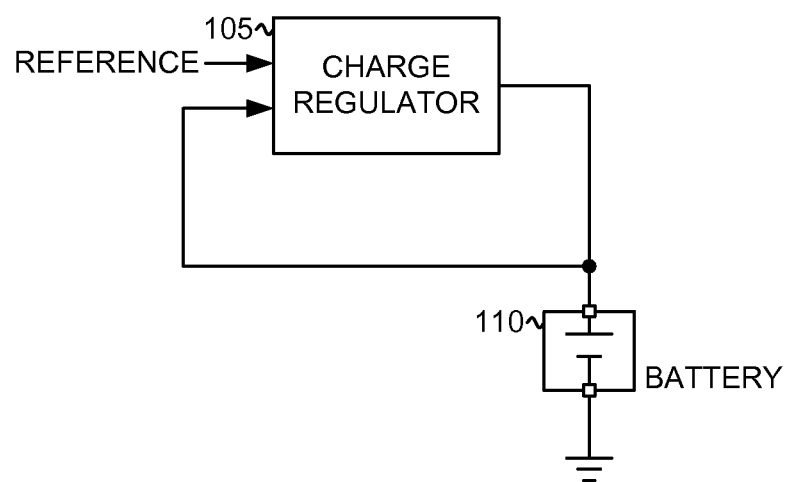
FIG. 1 illustrates generally an example prior art charging circuit.
Figure 2:
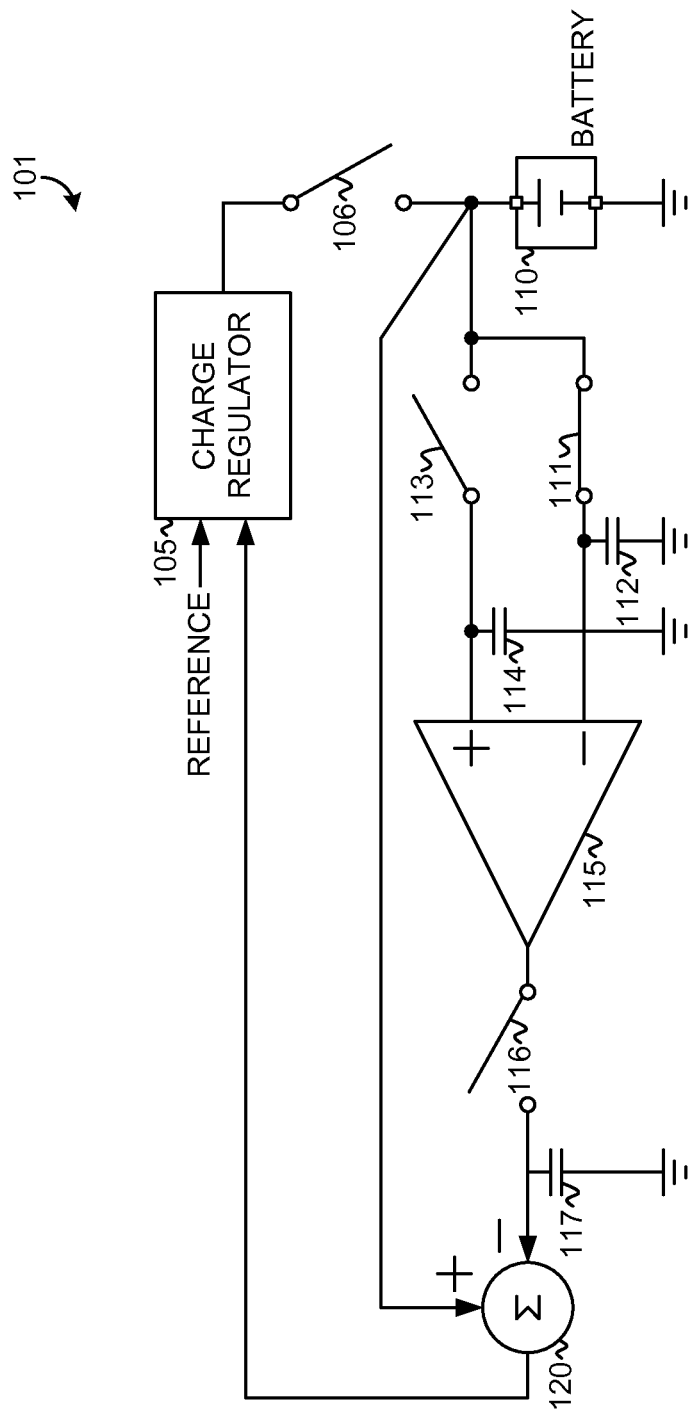
FIG. 2 illustrates generally an example charging circuit for an energy storage device during a first interval.
Figure 3:
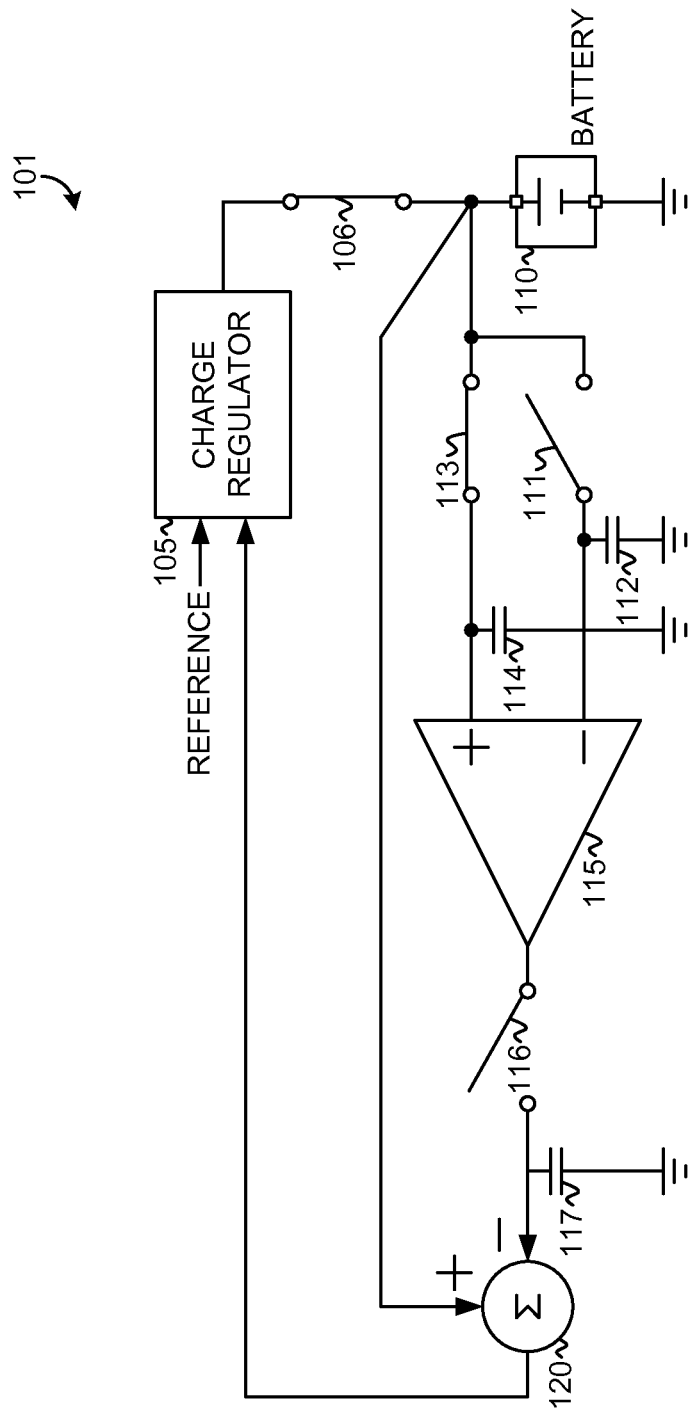
FIG. 3 illustrates generally the example charging circuit for an energy storage device during a second interval.
Figure 4:
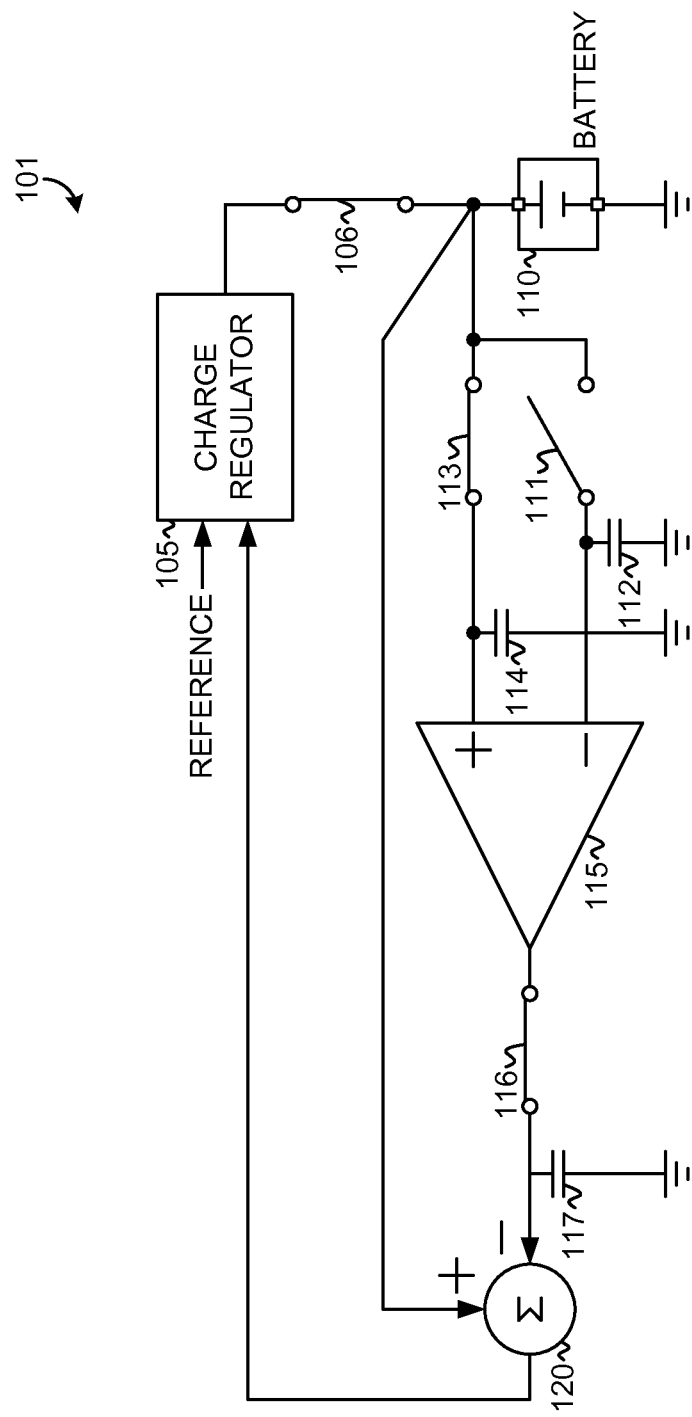
FIG. 4 illustrates generally the example charging circuit for an energy storage device during a third interval.

FIGS. 2-4 illustrate generally an example charging circuit 101 for an energy storage device, such as a battery, during various intervals. In an example, the charging circuit 101 can include a charge regulator 105, a battery 110, an amplifier 115, and a summing circuit 120. In various examples, the charge regulator 105 can receive power from a source, such as a wall charger or one or more other sources, and can provide a charging current or voltage to the battery 110.

In an example, the charging circuit 101 includes a charge switch 106 between the charge regulator 105 and a first terminal of the battery 110, an OCV sample switch 111 between the first terminal of the battery 110 and a first terminal of an OCV storage capacitor 112 and an input (e.g., an inverting input) of the amplifier 115, and a charge voltage sample switch 113 between the first terminal of the battery 110 and a first terminal of a charge voltage storage capacitor 114 and an input (e.g., a non-inverting input) of the amplifier 115. In an example, the OCV storage capacitor 112 can be configured to store an OCV of the first terminal of the battery 110, and the charge voltage storage capacitor 114 can be configured to store a voltage of the first terminal of the battery 110 during charging, depending on the states of the charge switch 106, the OCV sample switch 111, and the charge voltage sample switch 113.

In an example, the amplifier 115 can be configured to output a difference between the OCV and the charge voltage through a difference sample switch 116 to a first terminal of a difference storage capacitor 117 and a first input (e.g., a negative input) of the summing circuit 120. The voltage from the first terminal of the battery 110 can be provided to a second input (e.g., a positive input) of the summing circuit 120. Accordingly, the summing circuit 120 can be configured to provide a corrected voltage feedback to the charge regulator 105. In an example, the corrected voltage feedback can be represented as the charging voltage of the battery 110 minus the difference between the charging voltage and the OCV. In an example, the charge regulator 105 can be configured to control the charging current or voltage using the corrected feedback voltage and a received reference voltage (e.g., a desired battery voltage).

In certain examples, the charging circuit 101 can include a charge controller (not shown) for sequencing the charge switch and the sampling switches during the charging process.

FIG. 2 illustrates generally an example charging circuit 101 for an energy storage device during a first interval where the OCV storage capacitor 112 is configured to sample an OCV of the battery 110. During the first interval, the charge switch 106, the charge voltage sample switch 113, and the difference sample switch 116 are in open states (e.g., high impedance states), and the OCV sample switch 111 is in a closed state (e.g., a low impedance state). When the OCV storage capacitor 112 is charged, or at the conclusion of the first interval, the OCV sample switch 111 can be opened.

FIG. 3 illustrates generally an example charging circuit 101 for an energy storage device during a second interval where the charge voltage storage capacitor 114 is configured to sample a voltage of the battery 110 during charging. During the second interval, the charge switch 106 and the charge voltage sample switch 113 are in closed states (e.g., low impedance states), and the OCV sample switch 111 and the difference sample switch 116 are in open states (e.g., high impedance states). When the charge voltage storage capacitor 114 is charged, the charge voltage sample switch 113 can be opened, and the amplifier 115 can provide an output, such as a difference voltage, indicative of the difference between the voltage of the OCV storage capacitor 112 and the charge voltage storage capacitor 114.

FIG. 4 illustrates an example charging circuit 101 for an energy storage device during a third interval where the output of the amplifier 115 is provided to the difference storage capacitor 117 and the summing circuit 120. During the third interval, the difference sample switch 116 can be closed to charge the difference storage capacitor 117 and to provide the output of the amplifier 115 to the summing circuit 120. The summing circuit 120 can subtract the voltage across the difference storage capacitor 117 from the voltage at the first terminal of the battery 110 to provide a corrected feedback to the charge regulator 105. The corrected feedback can be compared to a reference voltage to adjust the output voltage and/or current of the charge regulator 105.

In an example, the charging circuit 101 can include a reference voltage generator (not shown) to provide the reference voltage to the charge regulator 105. In other examples, the reference voltage can be provided by an external or other source.

In certain examples, the second and third intervals are long relative to the first interval so the sampling of OCV does not negatively impact the total charge time of the battery. In some examples, the first interval is very short to minimize electrical/chemical effects of the battery 110 from reducing the OCV. For example, the first interval can be 100 ms, and can reoccur every 2-5 minutes. In certain examples, current to the energy storage device can be limited by a controlled current loop. In some examples, a separate voltage loop can be used to control or limit the maximum voltage at the energy storage device during charging. The systems and methods described herein can compensate for the internal voltage drop of the energy storage device (e.g., the battery 110) without specifically measuring or having previous knowledge of the charging path resistance or the charging current. Moreover, the systems and methods described herein are more accurate than estimating the internal voltage drop, allowing optimization of the charge rate of the energy storage device.

FIGS. 2-4 illustrate an analog solution using capacitors and switches to sample and hold desired voltage values. In other examples, other techniques, such as using analog-to-digital converters (ADC) or digital-to-analog converters (DAC), can be used to provide the difference in OCV and CCV to the charge regulator.

In an example, the charging circuit 101 can be a component in a mobile electronic device between the external charge source (e.g., a wall charger, etc.) and the battery 110 (e.g., a battery internal to the mobile electronic device). In other examples, the charge regulator 105 can be incorporated in the external charge source.

Additional Notes and Examples

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An apparatus comprising:
a charge regulator configured to receive power from an external source and to control a charging current or voltage to a battery through a first switch;
a first capacitor coupled to a first terminal of the battery through a second switch, the first capacitor configured to sample an open circuit voltage (OCV) of the battery in a first interval;
a second capacitor coupled to the first terminal of the battery through a third switch, the second capacitor configured to sample a voltage of the battery during charging in a second interval; and
an amplifier having a first terminal coupled to the first capacitor and a second terminal coupled to the second capacitor, the amplifier configured to provide an output indicative of the difference between the OCV of the battery and the voltage of the battery during charging,
wherein the charge regulator is configured to control the charging current or voltage to the battery using the output of the amplifier.

2. The apparatus of claim 1, including a summing circuit having a first terminal configured to receive the voltage of the battery during charging and a second terminal configured to receive the output of the amplifier,
wherein the summing circuit is configured to provide a corrected voltage feedback, and
wherein the charge regulator is configured to control the charging current or voltage to the battery using the corrected voltage feedback.

3. The apparatus of claim 2, wherein the summing circuit is coupled to the output of the amplifier through a fourth switch.

4. The apparatus of claim 2, wherein the first terminal of the summing circuit includes a positive terminal and the second terminal of the summing circuit includes a negative terminal.

5. The apparatus of claim 2, wherein the charge regulator is configured to control the charging current or voltage to the battery using the corrected voltage feedback and a reference voltage.

6. The apparatus of claim 1, including a third capacitor coupled to the output of the amplifier through a fourth switch, the third capacitor configured to store the output of the amplifier.

7. The apparatus of claim 1, wherein the first terminal of the amplifier includes an inverting terminal and the second terminal of the amplifier includes a non-inverting terminal.

8. The apparatus of claim 1, wherein the charge regulator is configured to control the charging current or voltage to the battery using the output of the amplifier and a reference voltage.

9. A method comprising:
receiving power from an external source at a charge regulator configured to control a charging current or voltage to a battery through a first switch;
sampling an open circuit voltage (OCV) of the battery using a first capacitor through a second switch in a first interval;
sampling a voltage of the battery during charging using a second capacitor through a third switch in a second interval;
determining a difference between the OCV of the battery and the voltage of the battery during charging using an amplifier;
controlling the charging current or voltage of the charge regulator using the determined difference;
opening the first switch and the third switch and closing the second switch during the first interval; and
opening the second switch and closing the first switch and the third switch during the second interval.

10. The method of claim 9, including:
receiving the voltage of the battery during charging at a first terminal of a summing circuit;
receiving the determined difference between the OCV of the battery and the voltage of the battery during charging at a second terminal of the summing circuit;
determining a corrected voltage feedback using the voltage of the battery during charging and the determined difference; and
wherein the controlling the charging current or voltage of the charge regulator includes using the corrected voltage feedback.

11. The method of claim 10, wherein the receiving the determined difference between the OCV of the battery and the voltage of the battery during charging at the second terminal of the summing circuit includes receiving the determined difference through a fourth switch.

12. The method of claim 10, wherein the first terminal of the summing circuit includes a positive terminal and the second terminal of the summing circuit includes a negative terminal.

13. The method of claim 10, wherein the controlling the charging current or voltage of the charge regulator includes using the corrected voltage feedback and a reference voltage.

14. The method of claim 9, including sampling an output of the amplifier using a third capacitor through a fourth switch in a third interval.

15. The method of claim 9, including:
receiving the OCV of the battery from the first capacitor at an inverting input of the amplifier;
receiving the voltage of the battery during charging from the second capacitor at a non-inverting input of the amplifier.

16. A system comprising:
a charge regulator configured to receive power from an external source and to control a charging current or voltage to a battery through a first switch;
a first capacitor coupled to a first terminal of the battery through a second switch, the first capacitor configured to sample an open circuit voltage (OCV) of the battery in a first interval;
a second capacitor coupled to the first terminal of the battery through a third switch, the second capacitor configured to sample a voltage of the battery during charging in a second interval;
an amplifier having a first terminal coupled to the first capacitor and a second terminal coupled to the second capacitor, the amplifier configured to provide an output indicative of the difference between the OCV of the battery and the voltage of the battery during charging;
a summing circuit having a first terminal configured to receive the voltage of the battery during charging and a second terminal configured to receive the output of the amplifier, the summing circuit configured to provide an output representative of the voltage on the first terminal minus the voltage on the second terminal,
wherein the charge regulator is configured to control the charging current or voltage to the battery using the output of the summing circuit.

17. The system of claim 16, wherein the summing circuit is coupled to the output of the amplifier through a fourth switch.

18. The system of claim 16, including a third capacitor coupled to the output of the amplifier through a fourth switch, the third capacitor configured to store the output of the amplifier.

19. The system of claim 16, wherein the first terminal of the amplifier includes an inverting terminal and the second terminal of the amplifier includes a non-inverting terminal.

20. The apparatus of claim 16, wherein the charge regulator is configured to control the charging current or voltage to the battery using the output of the summing circuit and a reference voltage.

* * * * *